United States Patent [19]

Mack

[11] 4,104,111
[45] Aug. 1, 1978

[54] PROCESS FOR MANUFACTURING PRINTED CIRCUIT BOARDS

[76] Inventor: Robert L. Mack, 1881 Martin Ave., Santa Clara, Calif. 95050

[21] Appl. No.: 821,604

[22] Filed: Aug. 3, 1977

[51] Int. Cl.² ............................................ C23F 1/02
[52] U.S. Cl. .................................. 156/656; 156/902; 174/68.5; 427/97
[58] Field of Search ..................... 204/15, 20, 21, 23, 204/27, 32 R, 43 S; 96/36.2, 38.4; 174/68.5; 29/624, 625; 427/96–98; 156/629–634, 656, 901, 902, 150

[56] References Cited

U.S. PATENT DOCUMENTS

| | | | |
|---|---|---|---|
| 3,772,101 | 11/1973 | Chumbres et al. | 156/656 |
| 3,907,621 | 9/1975 | Polichette et al. | 96/36.2 X |
| 4,024,631 | 5/1977 | Castillero | 29/625 |

*Primary Examiner*—William A. Powell
*Attorney, Agent, or Firm*—Michael L. Harrison

[57] ABSTRACT

Printed circuits are fabricated by a process which employs initial chemical deposition of copper on a pre-drilled substrate followed by electroplating build-up of conductors to desired pattern. The conductors are then passivated by thinly plating them with a mechanically durable, chemically passive metal. To provide solder compatibility in areas where connections are to be made to the printed circuits, a plating of tin/lead is applied in those areas while making all other areas to eliminate plating. The remaining exposed copper is then etched away. An insulating solder mask is then applied.

10 Claims, 10 Drawing Figures

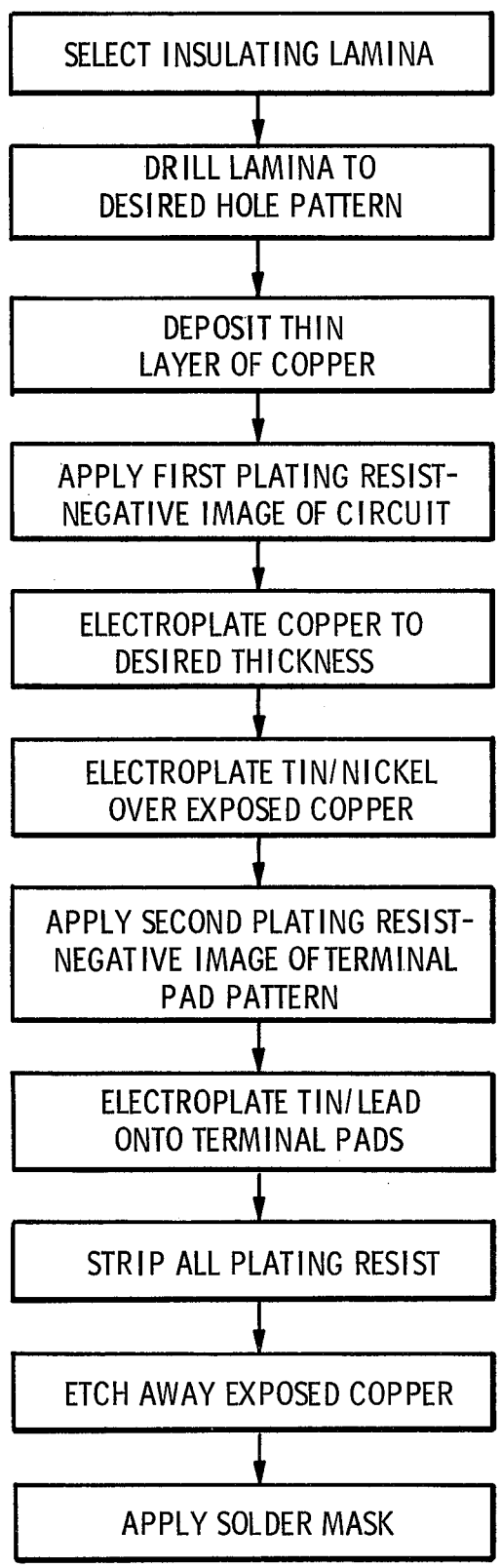
Fig_1

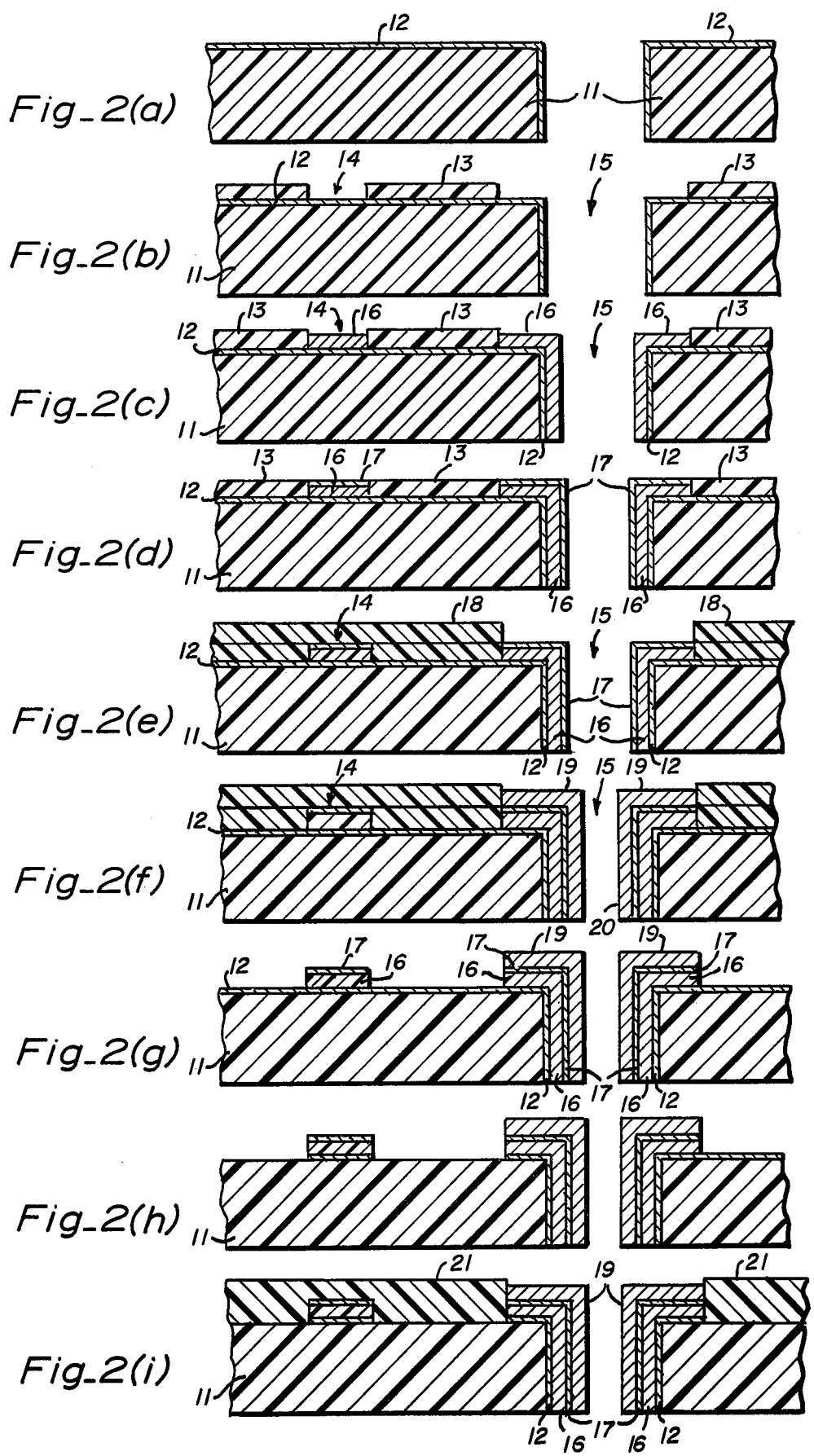

PROCESS FOR MANUFACTURING PRINTED CIRCUIT BOARDS

BACKGROUND OF THE INVENTION

1. Field of the Invention

This invention relates to the field of printed circuit assemblies manufacturing and, in particular, to processes for manufacturing printed circuit boards.

2. Prior Art

Since their discovery, printed circuit techniques have become a commercially important part of almost every area of the electronics industry. Printed circuitry has become virtually the only economically viable technique for the interconnection of components in even fairly low volume production. In high volume production, printed circuitry is universally employed.

Recent technological developments in integrated circuits and their consequent widespread acceptance and use in essentially every phase of consumer, commercial, industrial and military and aerospace electronics have resulted in two conflicting demands being placed upon printed circuit manufacturers. First, the complexity of the interconnection required, coupled with the inherent miniaturization of integrated circuits themselves have led to increased demands for further and further miniaturization of printed circuits in order to accommodate the desired integrated circuit functions within a package which does not become so large that the advantage of miniaturization is lost in the interconnection process. Second, as circuit densities increase in response to the demand for miniaturization and the complexity and number of interconnection likewise increase, the opportunities for failure similarly increase thereby giving rise to a demand for inherently higher reliability interconnection techniques. The response to these demands has been a series of improvements in printed circuit manufacturing processes with consequently higher densities and reliabilities being obtained. Still further improvement is needed, however, in order to allow further miniaturization and reliability improvements.

Of particular concern in the past have been the techniques employed for plated-through holes, and the compatibility of the printed circuits themselves with mass-production soldering equipment such as "wave" soldering. To use plated-through holes as conductors or as component lead receptables it is necessary that a solder-compatible material, preferably solder itself, be plated on the walls of the holes and on adjacent terminal pad areas. To do this realiably, the usual solution has been to apply solder to all areas of the conductor traces. Both the presence of the solder and the method of applying it, however, contribute to a loss of reliability and a limitation on the useful life of the board as well as placing severe restriction on the minimum spaces allowable between adjacent conductors.

PRIOR ART TECHNIQUES

The superiority of the present invention in overcoming these problems may best be seen in its relationship to the three commonly used processes which make up the bulk of the present day volume in printed circuit board manufacturing.

All of the presently known printed circuit fabrication processes are commenced with the rendering of a schematic circuit diagram into a master art-work layout in a facsimile of the desired conductor pattern. The layout may be done in larger-than-actual size for ease of layout and to enhance accuracy. Typically, it is done at ratios varying from 2:1 to 4:1, on a dimensionally stable, transparent base such as Mylar. After the art-work layout is completed and checked, it is photographically reduced to an actual size film which may be positive or negative, or both, depending upon the photographic processes to follow. From this point on, two different uses are made of the films. They may be used directly in contact with the printed circuit board, as a contact print film for the exposure of photo-resist, or they may be used indirectly as the master for photographic processing of silk-screens to be used in application of various processing chemicals or substances.

COPPER-TIN/LEAD PROCESS

A typical plated-through hole printed circuit assembly using the conventional and well known copper-tin/lead technique is accomplished as follows.

A substrate of copper-clad insulating material, usually fiberglass-epoxy, is drilled to a pre-established hole pattern suitable for the accommodation of component leads to be mounted on the board in accordance with requirements established during the preparation of the art-work layout. On the drilled board, a thin layer of copper is deposited by electroless chemical deposition. The purpose of this first thin layer is to provide a continuous conducting path over the entire surface of the board, including the walls of the previously drilled holes.

A negative image of plating resist is then applied to the thinly-plated board by either silk-screening or by a dry-film process, leaving exposed only those portions of the board on which it is desired to have circuit conductors.

After selectively masking the board, the exposed areas of previously deposited copper, including the hole walls, are electroplated with copper to build up the circuit traces to the desired thickness. A plating of tin/lead is then applied over the exposed copper in the desired thickness to provide a solder compatible surface for component attachment.

The negative image resist is next chemically stripped leaving exposed the remaining thin layer of chemically deposited copper which is then etched away by immersion in the etching bath.

Heat is then applied to the printed circuitry to cause the tin/lead plating to amalgamate into solder.

If desired, a solder mask may be applied over the board by silk-screen techniques, leaving only those portions of the circuit to which connection of component leads or discrete wiring, or on which connectors will be installed, uncovered. By using a solder mark in this and other processes, "bridging" of closely spaced circuit paths is avoided when components are mounted and the printed circuitry is soldered in a "wave" soldering process.

MASK-OVER-COPPER

Another widely used technique is the so-called "mask-over-copper" process. This process combines copper-clad wall plating to the desired thickness. A hole pattern is first drilled, then copper is chemically deposited to line the hole walls. Organic etching resist is then applied to plug the holes, protecting the hole walls from subsequent etching steps. A layer of organic etching resist in a positive pattern is then applied thereby defining the circuit conductor to be "printed" on the board. The entire board is then submerged in an etching bath which removes the exposed copper leaving behind only those areas of copper covered by the etching resist.

All organic resist is then chemically stripped from the board leaving behind a bare copper conductor pattern with copper walled holes. A solder mask of heat resistant insulating material, typically a two-part epoxy is then applied to the board in a pattern which leaves only the terminal pad areas for component mounting and all hole areas uncovered. Following application of the solder mask, the board receives an application of solder flux. The entire board is then dipped into molten solder causing the exposed, fluxed copper to become coated by the solder. Since an excess of solder may adhere to the board causing bridged traces and plugged holes, it must be removed either by "slinging" or "hydrosqueegee." "Slinging" is a relatively crude method which basically entails rapidly moving the board in an arcuate path thereby causing a high centrifugal force which in turn causes the excess molten solder to separate from the board.

"Hydro-squeegee" refers to a method of directing a high-pressure stream of hot oil onto the board, causing the solder to become or remain molten while the force of the oil on the board causes the excess solder to be separated from the board.

The board is then trimmed to final configuration and is ready for component mounting and final soldering.

Both the "slinging" and "hydro-squeegee" methods suffer from the severe drawback that they are highly inexact. The thickness of the solder coating is subject to gross variations depending upon difficult-to-control factors such as the temperature profile of the board, the geometry of the traces, cool-down rates and the like. Thus, in hotter areas of the board, a thinner coating will result. In areas where sharp bends in traces occur, thicker coating tends to accummulate. At the edge of all wide traces, the coating tends to be thicker than in the middle of the traces.

The non-uniformity of the solder coating is most critical in the vicinity of the holes. At the top and bottom of the hole, a sharp discontinuity in the surface tends to cause a thinner coating at precisely the point that a thicker coating would be desirable from a mechanical strength standpoint. At the other extreme, inside the hole, a thicker than desired coating can be easily built up due to surface tension effects and the difficulty of removing any excess solder which finds its way into the hole. At the extreme, completely plugged holes result which required individual clearing before the board can be used.

An additional drawback is that when the board is dipped into the molten solder, the board and its traces are subjected to extreme thermal shock. The resulting stresses can cause delamination of the traces from the board, and delamination of the solder mask.

The "mask-over-copper" process can be relatively economical since electroplating is not required to be used. It is satisfactory for commercial quality printed wiring boards where trace uniformity is not critical and where entrapment of foreign materials in the solder coating is not a problem.

ADDITIVE PROCESS

A third widely used technique is the so-called "additive" process. Printed circuitry is made in accordance with this process by chemically depositing copper to the required thickness on an insulating substrate. Typical steps in fabricating printed circuit boards in accordance with this process are as follows.

An insulating substrate, typically a glass-epoxy lamina is drilled in the required hole pattern. A coating of a strippable organic mask is then applied in a pattern corresponding to a negative image of the desired circuitry. The coated board is then chemically plated with copper with the thickness of the plating being built up to the desired thickness by adjusting the time of immersion in the bath. Plating of the exposed board surfaces includes the walls of the previously drilled holes as well. After building up the circuit traces to the desired thickness, the board is chemically stripped of all organic material leaving behind the chemically plated copper in the desired trace pattern. A solder mask is then applied as in "mask-over-copper" processing, leaving only pad and interconnect areas exposed. These exposed areas are then coated with flux, and dipped into molten solder. The excess solder is removed by "slinging" or "hydro-squeegee." After trimming to final outline, the board is ready for component mounting and final soldering.

As is the case with mask-over-copper processing, the "additive" type board is subjected to severe thermal shock by dipping the board into molten solder. The same problems of solder coat uniformity and impurity entrapment exist as with mask-over-copper boards.

Additive boards, like mask-over-copper boards, are inexpensive to produce since electroplating steps are not required. However, chemical plating of copper is a slow process requiring approximately 6 hours in the bath to acheive each 1 mil of thickness.

SUMMARY OF THE PRESENT INVENTION

Accordingly, it is an object of the present invention to provide a new method for the fabrication of printed circuit boards having longer life and higher reliability than previously manufactured boards.

It is another object to provide a new method for the fabrication of printed circuit boards having higher wiring densities than previously manufactured boards.

It is still another object of the present invention to provide a new method for the fabrication of printed circuit boards having better repairability and solderability.

Briefly, these and other objects are accomplished in accordance with the present invention by first chemically depositing copper onto a pre-drilled copper-clad substrate, then applying a negative-image plating resist in the pattern desired. Circuit traces are built up to the desired thickness by electroplating the desired metal onto the circuit pattern. Over the copper a plating of durable, chemically passive metal such as tin/nickel is next plated which serves as etching resist in later steps and provides a desirable surface finish for the copper. A coating of plating resist in the negative image of the desired terminal pad and connector areas is then applied followed by final electroplating of tin/lead onto the terminal pads and connector areas. The plating resists are then chemically stripped and the remaining exposed copper is etched away.

BRIEF DESCRIPTION OF THE DRAWINGS

These and other objects are achieved by the present invention by means which are best understood by making reference to the drawings wherein:

FIG. 1 is a table showing the sequence of processing steps of the present method.

FIG. 2, part (a) through (i) show a cross-sectional view of a representative part of a printed circuit board at various stages of processing in accordance with the present invention.

DESCRIPTION OF THE PREFERRED EMBODIMENT

An embodiment of the present invention is shown in the drawings and is described herein. It should be noted that FIG. 2 has been simplified for clarity and does not depict a circuit having any known use. Furthermore, the dimensions depicted are exaggerated, particularly the thicknesses of the metallic layers and the resist coatings, with respect to the thickness of the substrate.

It will be recognized and understood that although specific materials are named and specific processes are used, that other equivalent materials and processes may be employed without departing from the scope of the method described and claimed.

In FIG. 1, a convenient summary of the steps utilized in practicing the present invention is shown. It will be desirable to refer to this summary from time to time while simultaneously referring to the following paragraphs and the steps of the process which are graphically depicted in FIG. 2 (a) through (i).

To manufacture a printed circuit in accordance with the present invention, it is first necessary that art-work master layouts be prepared which are exactly-to-scale, graphical representations of the circuit patterns which are desired, including the location and size of any holes which are required for component lead attachment. It will further be required that photographic, or otherwise, duplication of the art-work master be accomplished in order to produce an exact size film of the desired circuit patterns. These requirements are conventional and well known in the art of printed circuit manufacture and will not be further discussed herein.

The actual processing of printed circuit boards in accordance with the present invention begins with selecting a laminar copper-clad substrate of dielectric material, suitable in area, thickness, and electrical properties for the requirements, in accordance with well known principles of material selection. A typical choice will be a copper-clad lamina of fiberglass-reinforced epoxy having a thickness of 1.6 mm (1/16 inch).

The lamina is then drilled in accordance with the previously established hole pattern, resulting in the required number, location and size of holes being arrayed over the lamina in exact registration with the circuit pattern to be deposited, as is also well known.

After drilling, the laminar substrate is cleaned and immersed in a copper depositing bath such as Shipley Chemical Company's Process 328-S, an aqueous solution containing sodium hydroxide with specific gravity of approximately 1.2, Ph factor 12 or greater, which bath chemically deposits a layer of copper over the entire surface of the substrate, including the walls of the previously drilled holes. A thin layer of copper of barely more than molecular thickness is allowed to be deposited before the substrate is removed from the bath. This step of the process is depicted in FIG. 2 (a) in which the substrate is removed from the bath. This step of the process is depicted in FIG. 2 (a) in which the substrate 11 is shown coated entirely with the copper layer 12, which comprises the copper-clad and chemically deposited copper layers.

Since the initial copper layer is provided only for the purpose of providing conductivity during processing over the entire surface of the substrate, and since much, and frequently most, of the copper so deposited will be etched away at the conclusion of the electroplating steps, it is unnecessary and undesirable to provide a thick copper layer at this stage. Thus, a copper-clad substrate having a thin copper layer is preferably selected and a very thin layer is chemically deposited.

After removal from the initial plating bath and cleaning, the substrate is placed in a silk-screening fixture having a silk-screen containing an actual size positive image of the desired circuit pattern. The circuit pattern is exactly registered with the previously drilled hole pattern on the substrate. Using the silk-screen, a uniform, relatively thick layer of organic plating resist, such as Warno Pr-1000 is applied over the copper layer. This plating resist is a modified vinyl intended for silk-screen printing which is chemically strippable without damage to the underlying copper.

Since the plating resist is applied only to those areas under the silk-screen where the silk-screen image is absent, a negative image pattern of plating resist will result.

It should be noted at this point that photo-resist may also be employed where silk-screen techniques are specified. Furthermore, for simplicity only, the processing of a single side of the substrate will be described, although it is more usual to employ two-sided or multi-layer boards, both of which simply require duplication of the process described for all sides of the board(s) having circuitry.

The present stage of the process is depicted at FIG. 2 (b) wherein the copper layer 12 is covered with the plating resist 13 in all areas except those shadowed by the silk-screen image, such as area 14 and area 15. Area 14 will become, following further processing, a circuit trace. Area 15 will become the terminal pad area into which a component lead will be inserted. At each such area in which it is desired to have a circuit conductor, the chemically deposited copper is left exposed.

Since the thin copper layer now provides continuous electrical conductivity across the entire board surface, it is possible to electroplate conductive materials onto any area of the exposed copper, with electroplating circuit continuity being provided simply by attaching an appropriate electrode to some part of the board, generally in an area along the board edge away from the desired circuit pattern.

Copper is next electro-plated onto the substrate to a thickness determined by the current carrying needs of the circuitry by immersing the substrate in an electrolytic copper plating bath such as Copper Gleam PC manufactured by Lee-Ronal, a solution of copper sulphate in sulphuric acid and chloride. A phosphorized copper anode is employed. This stage of processing is shown in FIG. 2 (c) in which a thick deposit of copper 16 is built up on the previously deposited thin copper layer 12.

After removing the board from the copper plating bath and cleaning, the board is reconnected to an electrode and placed into a tin/nickel plating bath such as "P-Sn-Ni" manufactured by M & T Chemicals, Inc., used in conjunction with 65% tin, 35% nickel electrodes.

Tin/nickel is plated over the copper in the same pattern as the copper was originally plated. At this point in the process, the desired circuit pattern is produced in tin/nickel over copper, as shown in FIG. 2 (d). In the figure, the tin/nickel layer 17 has been deposited over the thick copper build-up 16.

In order to provide a solder-compatible surface in the terminal pad and connector areas it is desirable to plate tin/lead onto those areas. It is not necessary, however, to plate tin/lead over all areas of the traces. Indeed, to do so is costly of materials and undesirable from a quality standpoint since tin/lead is a less inert surface than tin/nickel and since it is subject to reflowing at the time of component soldering. In addition, since the tin/lead is softer than tin/nickel, it provides an unacceptable surface for use as connector contacts.

When a conventionally fabricated printed circuit board having closely spaced conductors is wave soldered, considerable bridging of exposed conductors frequently occurs. Applying a conformally coated solder mask alleviates this problem. But, if tin/lead coated conductors are used, flowing of the tin/lead underneath the mask and release of impurities which are entrapped in the tin/lead during processing can cause blistering, distortion, brittlization and weakening of the mask.

To avoid these drawbacks, the present process employs a second plating mask having a negative image of the areas which require solder compatibility. The second mask is applied directly over the first, without removing any previous masks, by using a silk-screen fixture having a silk-screen embodying a positive image representation of the desired terminal pad and connector areas. Following application of this second mask, only connector areas and terminal pad areas including the holes and hole walls are uncovered. This stage of processing is show in FIG. 2 (*e*) wherein area 14 and surrounding areas are now covered by the second layer of plating resist 18. Area 15, a terminal pad area, however, is left exposed.

The areas of tin/nickel now remaining exposed are cleaned and chemically reactivated using, for example, a 35 to 50% solution of hydrochloric acid to remove oxides and provide a surface compatible with tin/lead plating. An electrode is then attached and the board is immersed into a tin/lead plating bath such as "Sn-Pb," a solution of stannous fluoborate and lead fluoborate concentrate in a fluoboric acid, used in conjunction with a tin/lead anode. In the bath a layer of tin/lead is plated onto all exposed pad areas including the interior hole walls to the desired thickness.

Electro-plating tin/lead onto the board allows a very uniform coating to be established even at points which would otherwise be subject to excessive or deficient plating build-up. The absence of non-uniformities is particularly advantageous in cases where tolerances on conductor spacings or hole diameters are critical. FIG. 2 (*f*) depicts this stage of processing showing the tin/lead plating 19 in area 15 including plating of the hole wall 20.

Following the tin/lead plating, both the first and second plating resist masks are chemically stripped from the board using a stripping solution which does not damage the underlying circuitry. One such solution is an alkaline bath sold under the brand name Liqui-Kleen, manufactured by Chemline Industries, used in a 10 to 20% solution by volume.

At this stage all electroplated materials have been applied to the board and it is possible to remove the thin copper still remaining since its use as a conductive layer is no longer needed. To avoid removing the desired conductive traces, however, a material which is relatively unaffected by the etching bath must be used to cover the traces. That function is provided usually by an organic coating of etching resist overlaid onto the traces in registration with the traces. Because exact registration is impossible to achieve, the edge definition of the traces suffers somewhat. A manufacturing allowance must ordinarily be made for the loss of definition thereby reducing the permissible circuit density.

In the present method, these registration problems are entirely avoided by using the tin/nickel layer as the etchant resist. Since tin/nickel and tin/lead are relatively inert materials in comparison with copper, the thin copper layer 12 may be etched away leaving the tin/nickel coated traces substantially unaffected as shown in FIG. 2 (*h*). The etchant must be selected to have little reaction with tin/nickel but great reaction with copper. An example of such an etchant is Continuetch MU-9106-a, an alkaline etchant having high copper capacity, Ph factor 8.0 to 8.5, manufactured by MacDermid Metex.

The tin/lead plating is then fused by heating the board to a temperature of approximately 480° F, in order to amalgamate the tin and lead into solder.

If required, edge connectors may be plated with a high conductivity material such as gold to provide lower contact resistance.

After a thorough cleaning, a permanent solder mask may be applied by silk-screening. It is usually desirable to apply a mask in order to realize the highest possible wiring densities since the mask will prevent most solder "bridging" which would otherwise occur. A suitable material for the mask is Chemline Industries' PC-401, a thixotropic two part epoxy base formulation. The board cross-section with mask 21 applied is depicted at FIG. 2 (*i*).

In addition to those advantages mentioned in the above description, the present method is superior to the prior art methods in several ways. In comparison to the conventional copper/tin-lead process, the present invention offers improved reliability, at approximately equivalent cost, through eliminiation of solder underneath the solder mask, while retaining the advantages of uniform solder thickness in solder-compatible areas. In addition, in those applications requiring board edge connectors, the hard, durable tin/nickel plating will provide, without further processing being required, an adequate contact area for most circuit requirements, excluding only those which require the optimally low contact resistance offered by gold plating. Because plating irregularities are substantially avoided by plating only the terminal pad areas, the required insulator distance between conductors may be minimized.

In comparison to the "additive" and "mask-over-copper" processes, the present invention offers improved reliability and utility while achieving the same conductor definition and, therefore, circuit density. In both prior art processes, extreme thermal shock is created by the immersion of the boards into molten solder and by removing excess solder with hot air blasts or hot oil sprays, steps which are avoided by the new process. Furthermore, since fluxing of the board is not required, no corrosive impurity entrapment results.

Through use of electroplated tin/nickel, the present process provides a passivated surface which is not subject to oxidation and which provides an inherently stronger circuit in the terminal pad and hole areas, the point of greatest weakness in the additive and mask-over-copper processes.

Since a layer of tin/nickel seals the copper at connection points, copper oxide migration from the copper layer into the solder, a common cause of joint failure is prevented.

Complete control of plating thickness is provided by the present method. The uniform solder layer provided by electroplating tin/lead over the tin/nickel and copper instead of dipping the board into molten solder also eliminates joint failures resulting from inadequate solder coverage while reducing plugged holes, a frequent occurence in solder-dipped boards.

In comparison with the additive process, much less time is required for manufacturing.

Repair of defective components is facilitated by the new method since the tin/nickel plating over the hole walls dramatically improves the mechanical durability of the hole thus reducing the danger of inadvertant removal of the hole wall.

Since the solder mask, if used, is applied over a uniform, stable conductor, the mask conforms more closely to the board and adheres more tightly. Solder liquification during wave soldering, a common occurrence with the copper-tin/lead and additive processes which leads to solder bridging under the mask, flaking and loosening of large ground plane areas and general loosening of the mask, is avoided.

It will be appreciated by those skilled in the art that other materials may be substituted for the specific examples provided. Although copper is the most desirable basic conductor, other conductive elements, alloys and compounds may be used. In selecting a substitute for tin/nickel, an acceptable substance must be electroplateable and must be mechanically durable. It must also be relatively inert in comparison with the copper underlayment when exposed to the etchant. Tin/lead in varying ratios and other eutectic alloys having low melting points may be selected for properties which are compatible with soldering processes in accordance with principles which are well known.

What is claimed is:

1. A process for the manufacturing of printed circuit boards, comprising:
    a. pre-drilling a dielectric substrate to the desired hole pattern;
    b. chemically depositing a first conductive material in a layer onto the surface of the substrate including the walls of the holes;
    c. coating the substrate with a first layer of plating resist in a negative image of the desired circuit pattern;
    d. plating a second conductive material onto said first conductive material, in those areas not covered by said first layer of plating resist, in the desired thickness;
    e. plating a durable, chemically passive third conductive material over said second conductive material;
    f. coating said first layer of plating resist and conductive material with a second layer of plating resist registered with the desired circuitry and in a negative pattern of the desired terminal pad and connector areas whereby said areas are left uncoated;
    g. cleaning and reactivating the uncoated areas of conductive material left uncoated following application of the second layer of plating resist coating;
    h. plating a eutectic alloy in the desired thickness to said uncoated areas of the conductive material;
    i. chemically stripping the first and second layers of plating resist from the substrate;
    j. immersing the substrate into a chemical etching bath, said bath being adapted to chemically etch away said first conductive material but to leave said third conductive material intact.

2. The process of claim 1 wherein the first conductive material is copper.

3. The process of claim 1 wherein the first and second conductive materials are copper.

4. The process of claim 1 wherein the third conductive material is tin/nickel.

5. The process of claim 1 wherein the eutectic alloy is tin/lead.

6. The process of claim 5 wherein the tin/lead alloy is fused by application of heat to the board.

7. The process of claim 1 wherein the first and second conductive materials are copper and the third conductive material is tin/nickel.

8. The process of claim 1 wherein the first and second conductive material is tin/nickel alloy, and the eutective alloy is tin/lead.

9. The process of claim 1 wherein the plating of conductive material in steps *d, e,* and *h* is done by electroplating.

10. The process of claim 1 wherein the dielectric substrate includes a copper-clad dielectric substrate.

* * * * *